(12) United States Patent
Hsu

(10) Patent No.: US 6,171,954 B1
(45) Date of Patent: Jan. 9, 2001

(54) METHOD OF MANUFACTURING SELF-ALIGNED CONTACT

(75) Inventor: Chen-Chung Hsu, Taichung (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/165,037

(22) Filed: Oct. 1, 1998

(30) Foreign Application Priority Data

Jun. 12, 1998 (TW) .................................................. 87109378

(51) Int. Cl.[7] .................................................. H01L 21/441
(52) U.S. Cl. .......................... 438/656; 438/645; 438/648
(58) Field of Search .................................. 438/233, 231, 438/586, 238, 253, 241, 383, 396, 239

(56) References Cited

U.S. PATENT DOCUMENTS

| 5,716,881 | * | 2/1998 | Lian et al. | 438/238 |
| 6,004,874 | * | 12/1999 | Cleeves | 438/622 |
| 6,010,935 | * | 1/2000 | Doan | 438/303 |

* cited by examiner

*Primary Examiner*—Mary Wilczewski
*Assistant Examiner*—David Goodwin
(74) *Attorney, Agent, or Firm*—J. C. Patents; Jiawei Huang

(57) ABSTRACT

A method of forming self-aligned contact comprises the steps of forming a cap layer on top of a gate structure. Then, sidewall spacers are formed on each side of the gate structure, while a self-aligned contact opening is formed above the source/drain region. Next, a polysilicon plug that couples electrically with the source/drain region is formed inside the self-aligned contact opening. A metallic material is deposited to fill the self-aligned contact opening, thereby forming a metal plug. The polysilicon plug and the metal plug together form a self-aligned contact. Alternatively, a polysilicon plug that couples electrically with the source/drain region is formed inside the self-aligned contact opening, and then a non-metallic material is deposited to fill the self-aligned contact opening thereby forming a stud. Subsequently, the stud is removed to form an opening and then a metal plug is formed in the opening. Hence, a self-aligned contact is again formed.

26 Claims, 8 Drawing Sheets

METHOD OF MANUFACTURING SELF-ALIGNED CONTACT

CROSS-REFERENCE TO RELATED APPLICATION

This application claims the priority benefit of Taiwan application Ser. No. 87109378, filed Jun. 12, 1998, the full disclosure of which is incorporated herein by reference.

BACKGROUND OF THE INVENTION

1. Field of Invention

The present invention relates to a method of manufacturing a MOS transistor device. More particularly, the present invention relates to a method of manufacturing a self-aligned contact (SAC).

2. Description of Related Art

The conventional method of manufacturing a self-aligned contact includes the steps of forming spacers on the sidewalls of a polysilicon gate structure, wherein the spacer is an insulating layer such as a silicon oxide layer. Then, a second insulating layer is formed over the gate structure, and subsequently the second insulating layer is etched to form a self-aligned contact. The spacers protect the gate structure against any damage during the etching operation. Finally, conductive material, for example, polysilicon or tungsten, is deposited into the contact to form a conductive layer, and then metal silicide is deposited to lower the resistance of the conductive layer further.

FIGS. 1A through 1E are cross-sectional views showing the progression of manufacturing steps in producing a self-aligned contact according to a conventional method.

First, as shown in FIG. 1A, a substrate 100 is provided. The substrate 100 can be a lightly doped P-well or a P-type semiconductor, for example. Next, a gate structure 102 is formed over the substrate 100. The gate structure 102 is formed by first depositing a gate oxide layer 104 over the substrate 100, and then forming a conductive stack layer 106 over the gate oxide layer 104. The conductive stack layer 106 is formed by first depositing a doped polysilicon layer (not shown) over the gate oxide layer 104, and then forming a metal silicide layer (not shown) over the doped polysilicon layer. For example, the gate oxide layer 104 can be formed by heating the substrate 100 to a temperature of about 800–1000° C. in an oxygen-filled atmosphere. The doped polysilicon layer of the conductive stack layer 106 can be formed by a deposition process using a low-pressure chemical vapor deposition (LPCVD) method. In general, impurities for the doped polysilicon layer including arsenic or phosphorus are deposited concurrently with the polysilicon deposition. Alternatively, the impurities can be implanted after a polysilicon layer is formed. The metal silicide layer of the conductive stack layer 106, for example, can be tungsten silicide, titanium silicide or molybdenum silicide. After the gate structure 102 is formed, an ion implantation operation is carried out to form a lightly doped source/drain region 110. For example, using the gate structure 102 as a mask, N-type ions such as arsenic or phosphorus are implanted into the substrate 100.

Next, as shown in FIG. 1B, an insulating layer 114 is formed over the substrate 100 using, for example, a chemical vapor deposition (CVD) method. The insulating layer 114 can be a silicon oxide layer or a silicon nitride layer, for example.

Thereafter, as shown in FIG. 1C, the insulating layer 114 is anisotropically etched back to form spacers 114a on the sidewalls of the gate structure 102. Consequently, a portion of the lightly doped source/drain region 110 is exposed and a self-aligned contact opening 122 is formed above the source/drain region 110. The spacers 114a not only protect the gate structure 102 against damage in etching operations, but also serve as a mask in the formation of heavily doped source/drain regions. In the subsequent step, using the spacers 114a as a mask, another ion implantation is carried out using a high dosage of N-type or arsenic ions, thereby forming a heavily doped source/drain region. Hence, source/drain regions 116 having A lightly doped drain (LDD) structure are formed.

Next, as shown in FIG. 1D, a dielectric layer 118 is formed over the substrate 100. For example, using a mixture of silane and oxygen as a reactive gas, a chemical vapor deposition (CVD) method is used to form a silicon oxide layer. Subsequently, the dielectric layer 118 is planarized using, for example, a chemical-mechanical polishing (CMP) method. Thereafter, photolithographic and etching techniques are used to pattern the dielectric layer 118, forming a self-aligned contact opening 122 that exposes the heavily doped source/drain region 116.

However, to avoid misalignment of the self-aligned contact (SAC) opening 122 that might possibly lead to short-circuiting of subsequently formed SAC with the gate structure 102, the width of the SAC opening 122 must be smaller than the distance between two neighboring gate structures 102. Since no etching stop layer is formed between the gate structure 102 and the dielectric layer above, the gate structure 102 may be damaged when the dielectric layer 118 is etched to form the SAC opening if misalignment occurs. In particular, as line width of devices continues to shrink, any misalignment can easily lead to a considerable increase in contact resistance between the contact and the source/drain region. In fact, design rules have set the lower limit of line width to about 0.25 μm because line width smaller than that will cause too much resistance in the self-aligned contact.

Next, as shown in FIG. 1E, conductive material such as tungsten is deposited over the dielectric layer 118 using, for example, a chemical vapor deposition (CVD) method. The conductive material completely fills the self-aligned contact opening 122. Thereafter, an etching back method or a chemical-mechanical polishing (CMP) method is used to remove a portion of the conductive layer and expose the dielectric layer. Consequently, a self-aligned contact 124 is formed inside the self-aligned contact opening 122.

However, the aforementioned self-aligned contact will misalign when the self-aligned contact opening is formed. Misalignment of the self-aligned contact can easily lead to undesirable electrical connection between the SAC and its neighboring gate structure. Therefore, width of the SAC must be smaller than the distance between two neighboring gate structures. Because there is no way of increasing width of a self-aligned contact opening in an era when line width of semiconductor devices continues to decrease, contact resistance between the source/drain region and the self-aligned contact will continue to rise.

In light of the foregoing, there is a need to improve the method of forming a self-aligned contact.

SUMMARY OF THE INVENTION

Accordingly, the present invention provides a method of forming a self-aligned contact. This method includes forming a cap layer over the gate structure so that the cap layer acts as an etching stop layer when the conductive layer is etched. The method also includes forming a polysilicon layer over the substrate so that the source/drain region is electrically coupled to the source/drain region, wherein the polysilicon layer also serves as an etching stop layer when another conductive layer is etched. Therefore, besides forming a self-aligned contact, the method is also capable of providing a self-aligned contact opening that has a width greater than the distance between two neighboring gate structures. Hence, contact resistance existing between the source/drain region and the self-aligned contact can still be maintained despite a reduction of the line width.

To achieve these and other advantages and in accordance with the purpose of the invention, as embodied and broadly described herein, the invention provides a method of forming a self-aligned contact. The method comprises the steps of forming a cap layer on top of a gate structure, and then concurrently forming sidewall spacers on each side of the gate structure and a self-aligned contact opening above the source/drain region. Next, a polysilicon plug that couples electrically with the source/drain region is formed inside the self-aligned contact opening. Then, a metallic material is deposited to fill the remaining space of the self-aligned contact opening thereby forming a metal plug above the polysilicon plug. The polysilicon plug and the metal plug together form a self-aligned contact. Alternately, a polysilicon plug that couples electrically with the source/drain region is formed inside the self-aligned contact opening. Then, a non-metallic material is deposited to fill the remaining space of the self-aligned contact opening, thereby forming a stud above the polysilicon plug. Subsequently, the stud is removed and then replaced by a metal plug formed inside the original stud location. Hence, a self-aligned contact is again formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
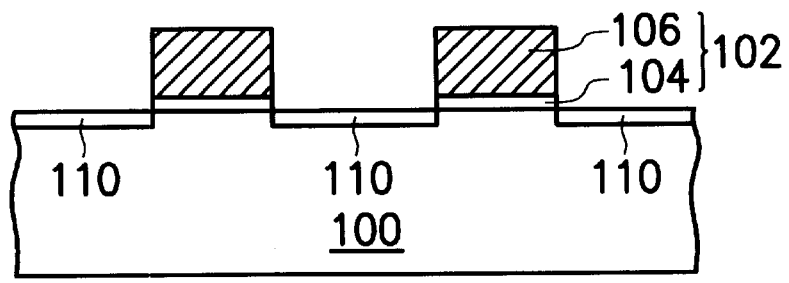
FIGS. 1A through 1E are cross-sectional views showing the progression of manufacturing steps in producing a self-aligned contact according to a conventional method.
Figure 1B:
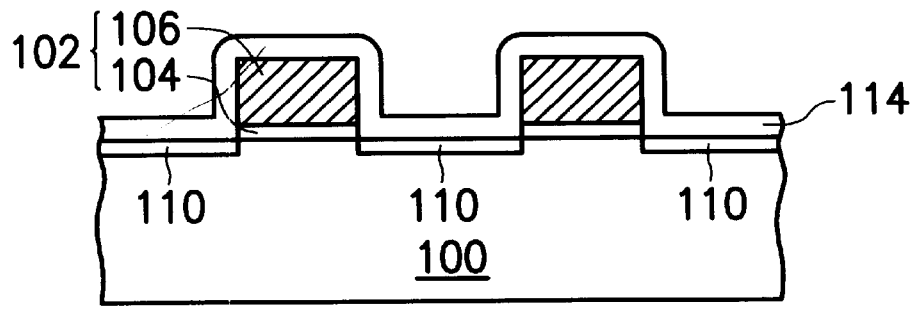
Figure 1C:
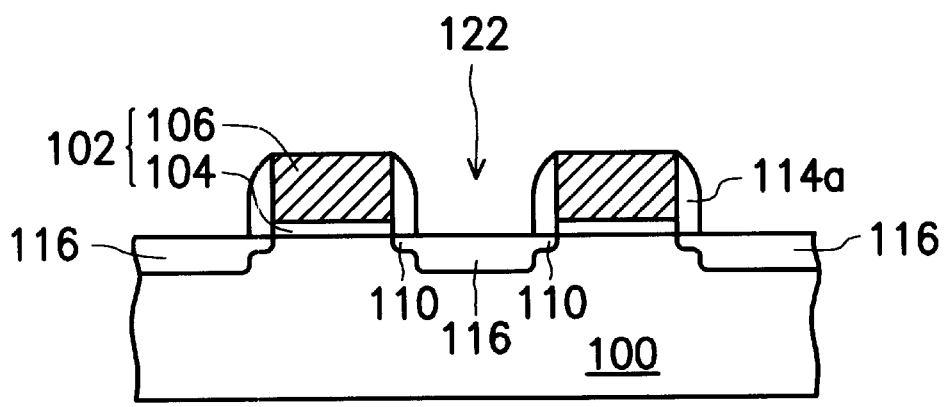
Figure 1D:
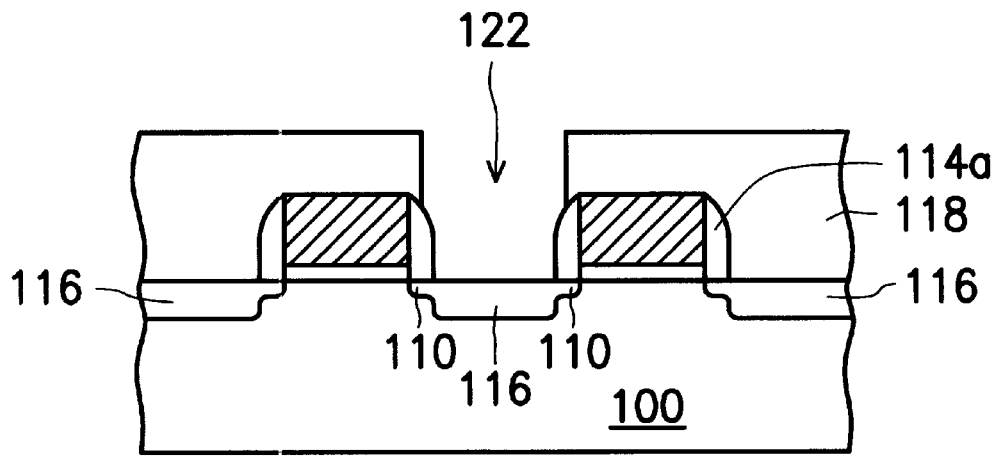
Figure 1E:
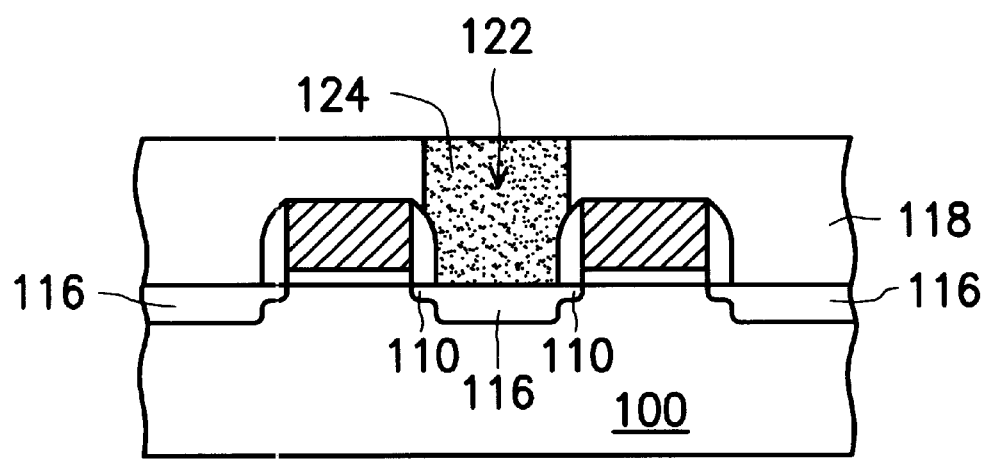

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2G are cross-sectional views showing the progression of manufacturing steps in producing a self-aligned contact according to a first preferred embodiment of this invention.

Figure 2A:
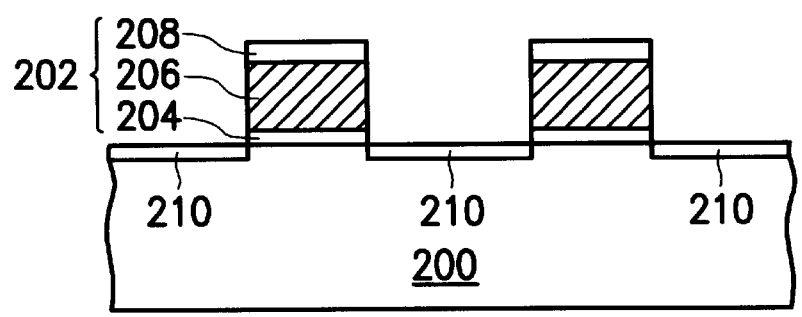
FIGS. 2A through 2G are cross-sectional views showing the progression of manufacturing steps in producing a self-aligned contact according to a first preferred embodiment of this invention.

First, as shown in FIG. 2A, a substrate 200 is provided. The substrate 200 can be a lightly doped P-well or a P-type semiconductor, for example. Next, a gate structure 202 is formed over the substrate 200. The gate structure 202 is formed by first depositing a gate oxide layer 204 over the substrate 200, and then forming a conductive stack layer 206 over the gate oxide layer 204. The conductive stack layer 206 is formed by first depositing a doped polysilicon layer (not shown) over the gate oxide layer 204, and then forming a metal silicide layer (not shown) over the doped polysilicon layer. Thereafter, a cap layer 208 is formed over the conductive stack layer 206 to form a complete gate structure 202. For example, the gate oxide layer 204 can be formed by heating the substrate 200 to a temperature of about 800–1000° C. in an oxygen-filled atmosphere. The doped polysilicon layer of the conductive stack layer 206 can be formed by deposition using a low-pressure chemical vapor deposition (LPCVD) method. In general, impurities for the doped polysilicon layer including arsenic or phosphorus are deposited concurrently with the polysilicon deposition process. Alternatively, the impurities can be implanted after the polysilicon layer is formed. The metal silicide layer of the conductive stack layer 206, for example, can be tungsten silicide, titanium silicide or molybdenum silicide. The cap layer 208 can be formed by depositing silicon oxide or silicon nitride using, for example, a chemical vapor deposition (CVD) method. After the gate structure 202 is formed, an ion implantation operation is carried out to form lightly doped source/drain regions 210. For example, using the gate structure 202 as a mask, N-type ions such as arsenic or phosphorus are implanted into the substrate 200.

Figure 2B:
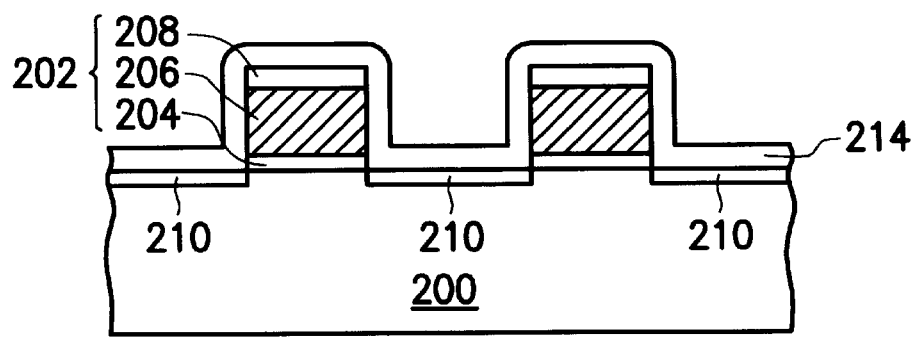

Next, as shown in FIG. 2B, an insulating layer 214 is formed over the substrate 200 using, for example, a chemical vapor deposition (CVD) method. The insulating layer 214 can be a silicon oxide layer or a silicon nitride layer.

Figure 2C:
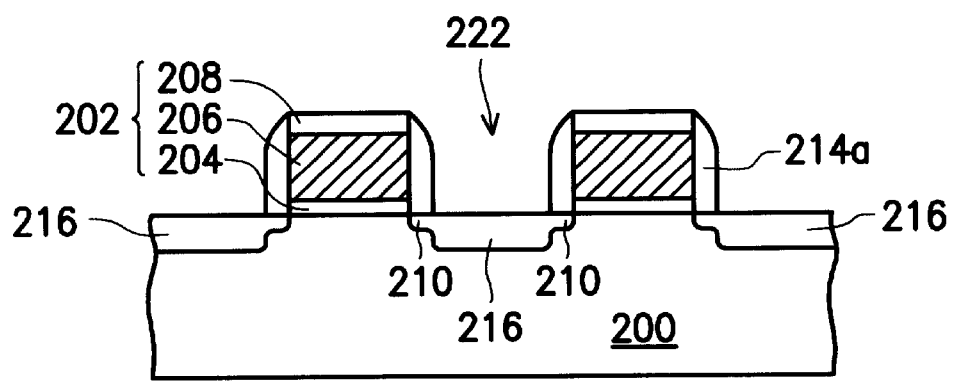

Thereafter, as shown in FIG. 2C, an anisotropic etching back operation of the insulating layer 214 is carried out to form spacers 214a on the sidewalls of the gate structure 202. Consequently, a portion of the lightly doped source/drain region 210 is exposed and a self-aligned contact opening 222 is formed above the source/drain region 210. The spacers 214a not only protect the gate structure 202 against damage in the etching operation, but also serve as a mask in the subsequent formation of heavily doped source/drain regions. In the subsequent step, using the spacers 214a as a mask, another ion implantation is carried out using a high dosage of N-type or arsenic ions, thereby forming a heavily doped source/drain region. Hence, source/drain regions 216 having lightly doped drain (LDD) structure are formed.

Figure 2D:
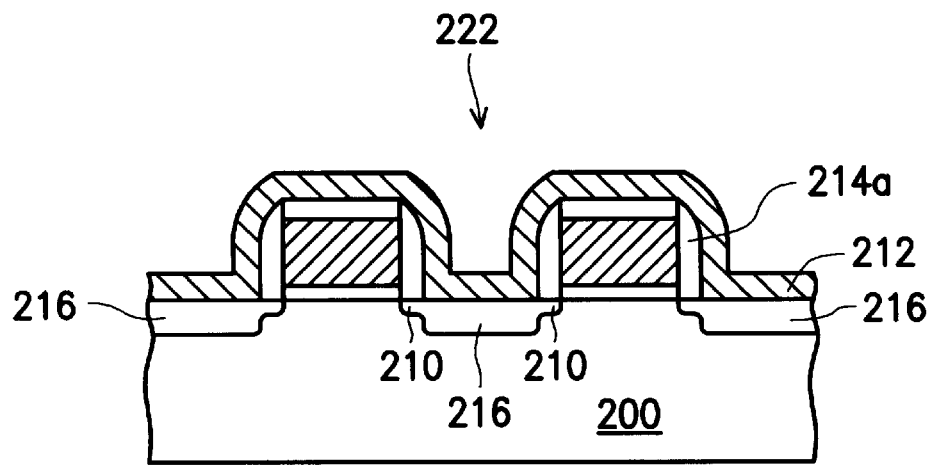

Next, as shown in FIG. 2D, a conductive layer 212 conformal to the gate structure 202 is formed above the substrate 200 using, for example, a CVD method. The conductive layer 212 can be a doped polysilicon layer that couples electrically with the heavily doped source/drain region 216. In general, impurities for the doped polysilicon layer including arsenic or phosphorus are deposited concurrently with the polysilicon deposition process. However, the impurities can be implanted after the polysilicon layer is formed. Doping the polysilicon layer increases its electrical conductivity.

Figure 2E:
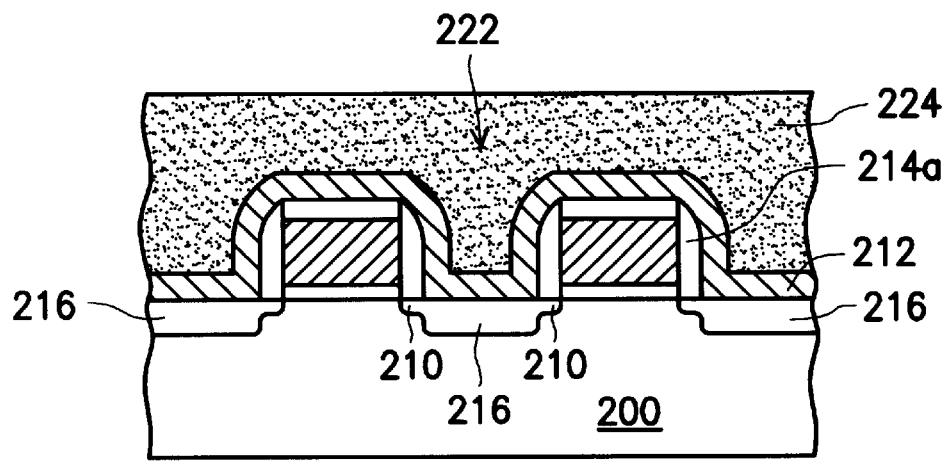

Next, as shown in FIG. 2E, another conductive layer 224 is formed over the conductive layer 212, for example, by depositing tungsten using a CVD method. The conductive layer 224 at least completely fills the self-aligned contact opening 222, and the conductive layer 224 covers the entire gate structure 202 as well.

Figure 2F:
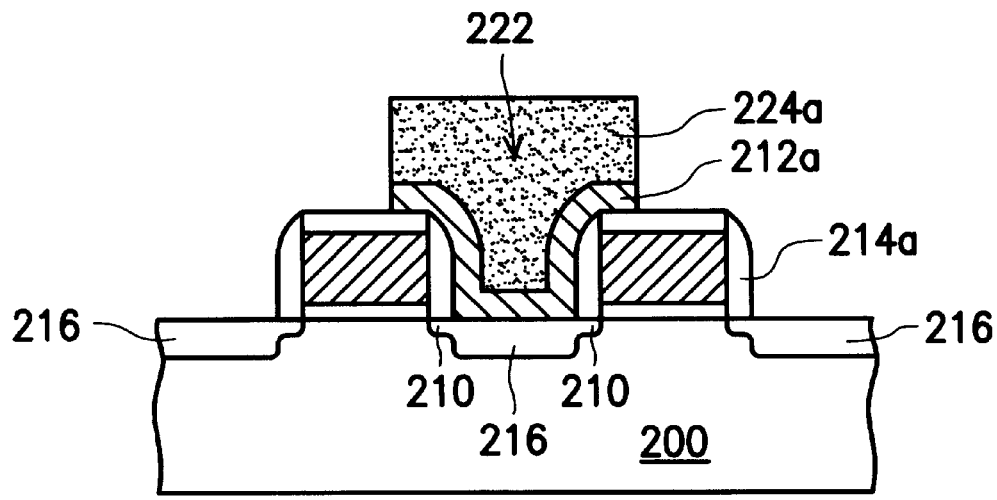

Next, as shown in FIG. 2F, conventional photolithographic and etching operations are used to pattern the conductive layer 224. For example, an anisotropic etching method is used to form a plug 224a in the self-aligned opening 222 above the heavily doped source/drain region 216. In addition, a portion of the conductive layer 212 (not shown in the figure) is also exposed. Thereafter, using the plug 224a as a mask, the exposed conductive layer 212 is etched using an anisotropic etching method. The anisotropic etching operations stops at the cap layer 208 above the gate structure is 202. Hence, another plug 212a is formed in the self-aligned contact opening 222 that couples electrically with the heavily doped source/drain region 216. Plugs 224a and 212a together form the self-aligned contact of this invention.

The aforementioned plugs 224a and 212a are self-aligned plugs. Moreover, since a cap layer 208 covers the tops of the gate structures, width of the plugs 224a and 212a can be wider than the distance between two neighboring gate structures 202. Furthermore, the operations required to form these plugs has better and simpler processing control, and contact resistance between the source/drain region and the self-aligned contact remains largely unaffected by the processing operation.

Figure 2G:
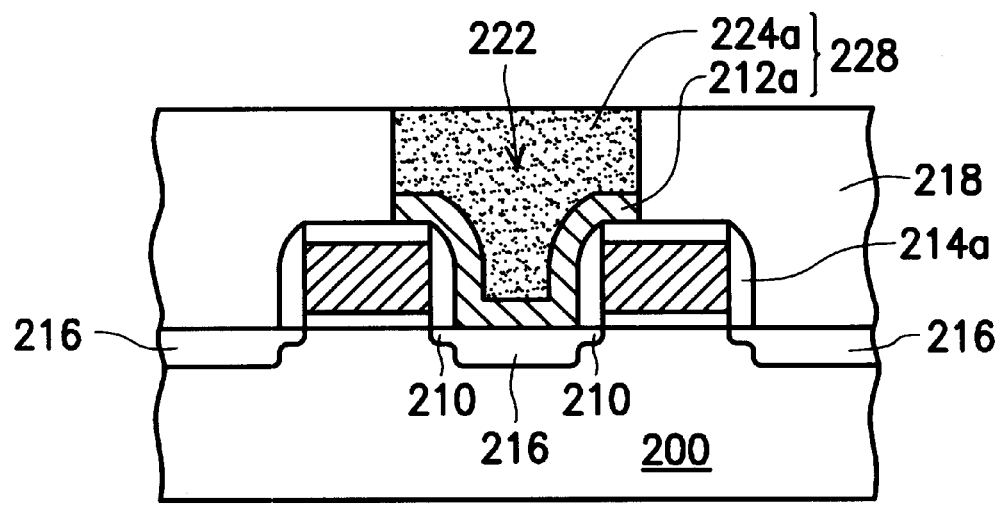

Next, as shown in FIG. 2G, a dielectric layer 218 is formed over the gate structures 202, the plug 224a and the substrate 200. For example, a CVD method can be used to form a borophosphosilicate glass (BPSG) layer. Alternately, an atmospheric pressure CVD (APCVD) method can be used with tetra-ethyl-ortho-silicate (TEOS) as the gaseous reactant to form a TEOS silicon oxide layer. Thereafter, the dielectric layer 218 is planarized using, for example, a chemical-mechanical polishing (CMP) operation. Polishing of the dielectric layer 218 stops when the top surface of the plug 224a is reached. Consequently, a self-aligned contact 228 is formed in the self-aligned contact region 226. The self-aligned contact 228 includes the plug 224a and the plug 212a, wherein plugs 224a and 212a are electrically connected, and the plug 212a and the source/drain region 216 are also electrically connected.

FIGS. 3A through 3I are cross-sectional views showing the progression of manufacturing steps in producing a self-aligned contact according to a second preferred embodiment of this invention.

Figure 3A:
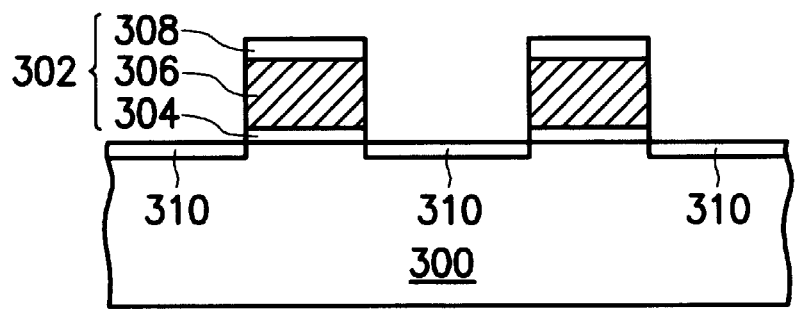
FIGS. 3A through 3I are cross-sectional views showing the progression of manufacturing steps in producing a self-aligned contact according to a second preferred embodiment of this invention.

First, as shown in FIG. 3A, a substrate 300 is provided. The substrate 300 can be a lightly doped P-well or a P-type semiconductor, for example. Next, a gate structure 302 is formed over the substrate 300. The gate structure 302 is formed by first depositing a gate oxide layer 304 over the substrate 300, and then forming a conductive stack layer 306 over the gate oxide layer 304. The conductive stack layer 306 is formed by first depositing a doped polysilicon layer (not shown) over the gate oxide layer 304, and then forming a metal silicide layer (not shown) over the doped polysilicon layer. Thereafter, a cap layer 308 is formed over the conductive stack layer 306 to form a complete gate structure 302. For example, the gate oxide layer 304 can be formed by heating the substrate 300 to a temperature of about 800–1000° C. in an oxygen-filled atmosphere. The doped polysilicon layer of the conductive stack layer 306 can be formed by deposition using a low-pressure chemical vapor deposition (LPCVD) method. In general, impurities for the doped polysilicon layer including arsenic or phosphorus are deposited concurrently with the polysilicon deposition process. Alternatively, the impurities can be implanted after the polysilicon layer is formed. The metal silicide layer of the conductive stack layer 306, for example, can be tungsten silicide, titanium silicide or molybdenum silicide. The cap layer 308 is formed by depositing silicon oxide or silicon nitride using, for example, a chemical vapor deposition (CVD) method. After the gate structure 302 is formed, an ion implantation operation is carried out to form a lightly doped source/drain region 310. For example, using the gate structure 302 as a mask, N-type ions such as arsenic or phosphorus are implanted into the substrate 300.

Figure 3B:
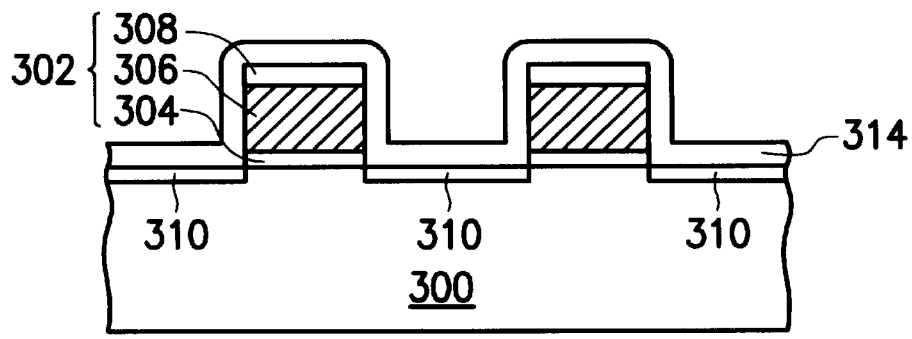

Next, as shown in FIG. 3B, an insulating layer 314 is formed over the substrate 300 using, for example, a chemical vapor deposition (CVD) method. The insulating layer 314 can be a silicon oxide layer or a silicon nitride layer, for example.

Figure 3C:
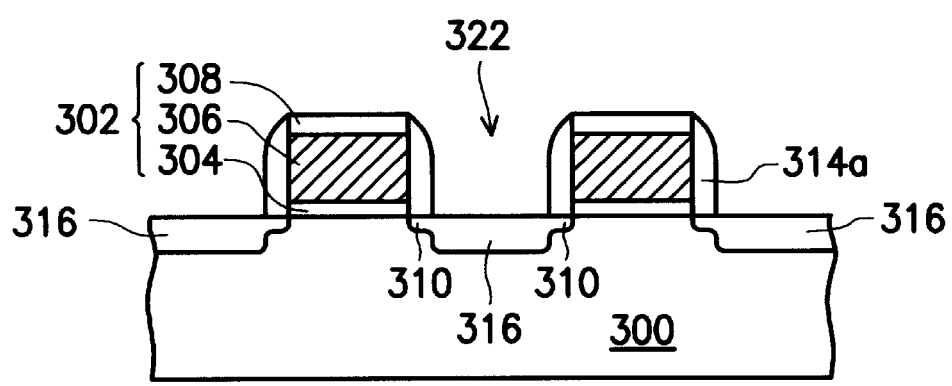

Thereafter, as shown in FIG. 3C, an anisotropic etching back operation of the insulating layer 314 is carried out to form spacers 314a on the sidewalls of the gate structure 302. Consequently, a portion of the lightly doped source/drain region 310 is exposed and a self-aligned contact opening 322 is formed above the source/drain region 310. The spacers 314a not only protect the gate structure 302 against damage in the etching operation, but also serve as a mask in the subsequent formation of heavily doped source/drain regions. In the subsequent step, using the spacers 314a as a mask, another ion implantation is carried out using a high dosage of N-type or arsenic ions, thereby forming a heavily doped source/drain region. Hence, source/drain regions 316 having a lightly doped drain (LDD) structure are formed.

Figure 3D:
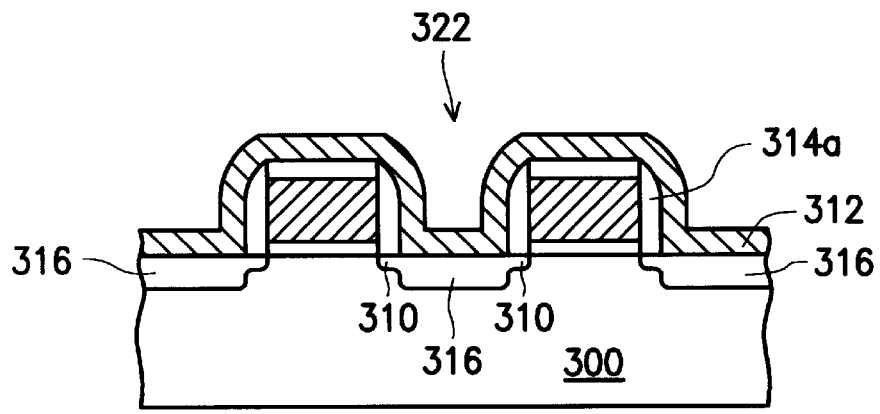

Next, as shown in FIG. 3D, a conductive layer 312 conformal to the gate structure 302 is formed above the substrate 300 using, for example, a CVD method. The conductive layer 312 can be a doped polysilicon layer that couples electrically with the heavily doped source/drain region 316. In general, impurities for the doped polysilicon layer including arsenic or phosphorus are deposited concurrently with the polysilicon deposition process. However, the impurities can be implanted after the polysilicon layer is formed. Doping the polysilicon layer increases its electrical conductivity.

Figure 3E:
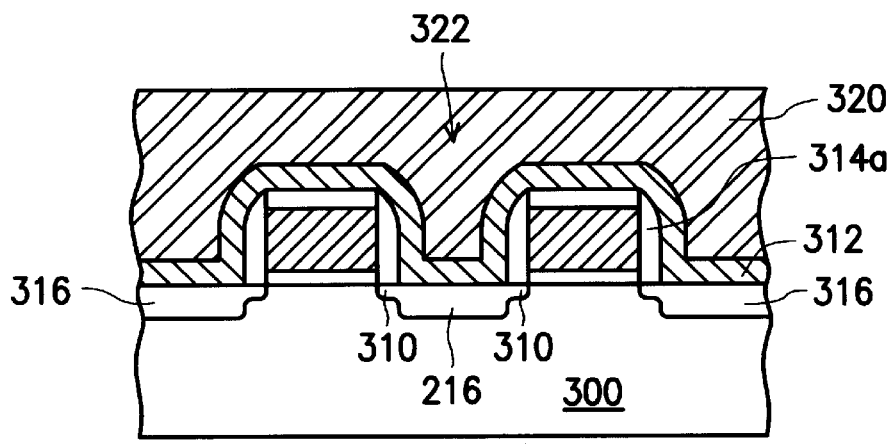

Next, as shown in FIG. 3E, a stud layer 320 is formed over the conductive layer 312, for example, by depositing silicon nitride using a CVD method. The stud layer 320 completely fills the self-aligned contact opening 322 and covers the entire gate structure 302 as well.

Figure 3F:
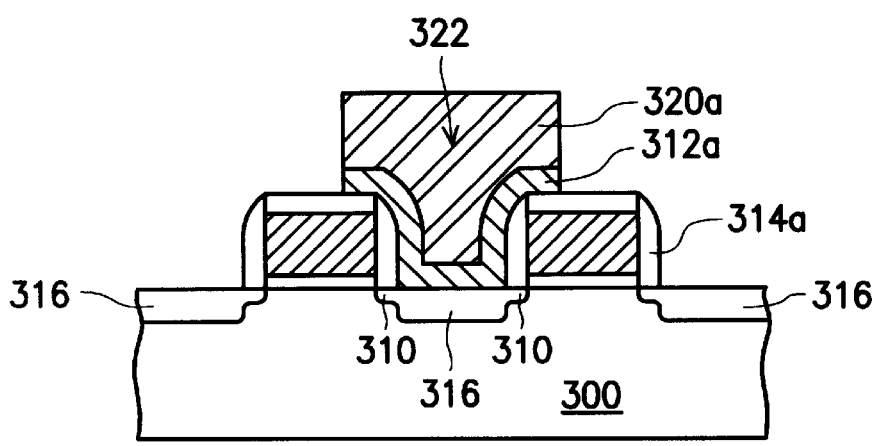

Next, as shown in FIG. 3F, conventional photolithographic and etching operations are used to pattern the stud layer 320. For example, an anisotropic etching method is used to form a stud 320a in the self-aligned opening 322 above the heavily doped source/drain region 316. In addition, a portion of the conductive layer 312 (not shown in the figure) is also exposed. Thereafter, using the stud 320a as a mask, the exposed conductive layer 312 is etched using an anisotropic etching method. The anisotropic etching operation stops at the cap layer 308 that covers the gate structure 302. Hence, a plug 312a is formed in the self-aligned contact opening 322 that couples electrically with the heavily doped source/drain region 316. The stud 320a and the plug 312a together fill the self-aligned contact opening 322.

The aforementioned stud 320a and plug 312a are self-aligned elements. Moreover, since a cap layer 308 covers the tops of the gate structures, width of the stud 320a and the plug 312a can be wider than the distance between two neighboring gate structures 302. Furthermore, the operations required to form these plugs are better and more simply controlled.

Figure 3G:
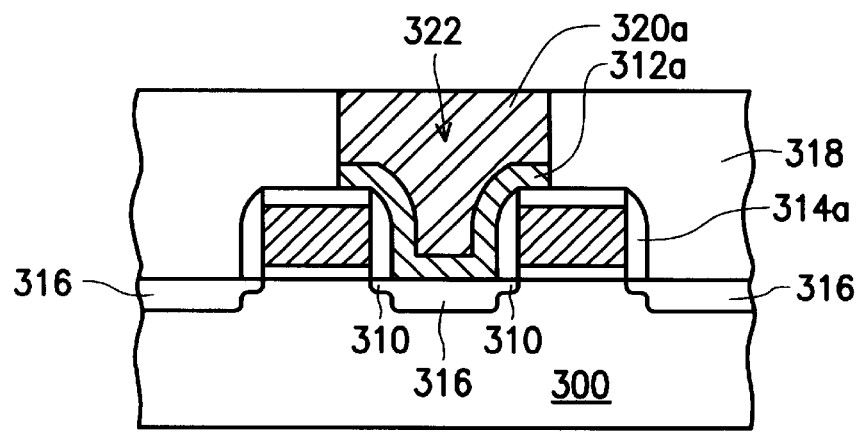
Figure 3H:
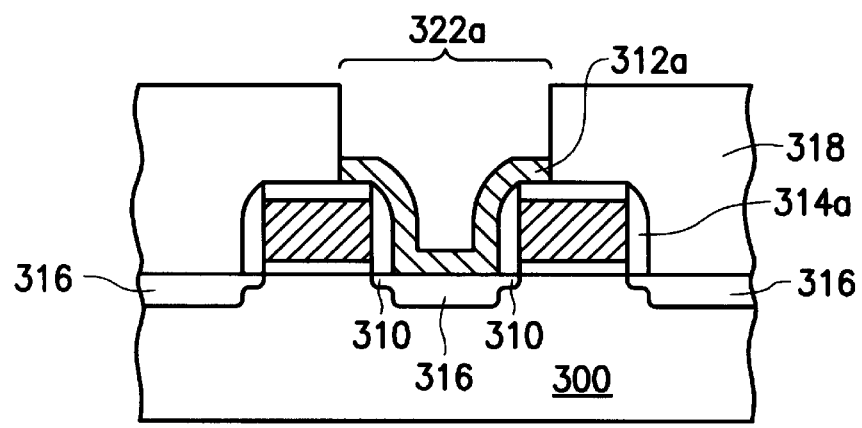

Next, as shown in FIG. 3G, a dielectric layer 318 is formed over the gate structures 302, the stud 320a and the substrate 300. For example, a CVD method can be used to form a borophosphosilicate glass (BPSG) layer. Alternatively, an atmospheric pressure CVD (APCVD) method can be used with tetra-ethyl-ortho-silicate (TEOS) as the gaseous reactant to form a TEOS silicon oxide layer. Thereafter, the dielectric layer 318 is planarized using, for example, a chemical-mechanical polishing (CMP) operation. Polishing of the dielectric layer 318 stops when top surface of the stud 320a is reached.

Next, as shown in 3H, the stud 320a embedded within the dielectric layer 318 is removed using, for example, a selective wet etching method. Consequently, an opening 322a is formed in the self-aligned contact opening region 326. The opening 326 exposes the upper surface of the plug 312a. Since the original stud 320a is self-aligned with the heavily doped source/drain region 316 at the bottom of the self-aligned contact opening 322, the opening 322a is also self-aligned with the source/drain region 316.

Figure 3I:
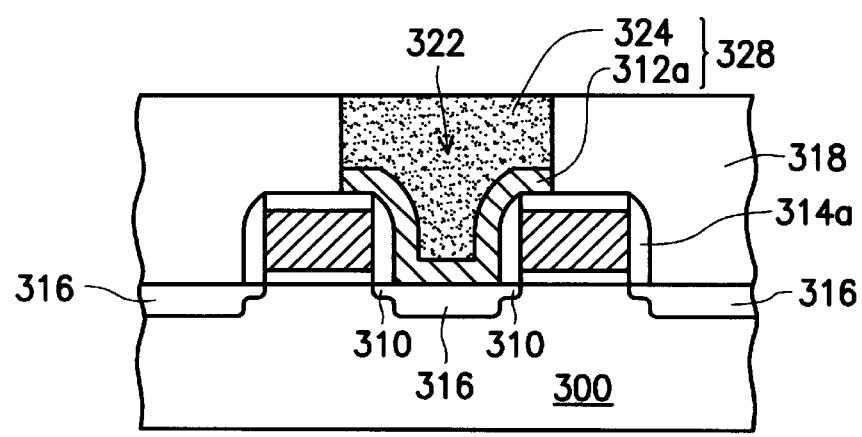

Next, as shown in FIG. 3I, a self-aligned contact 328 is formed in the self-aligned contact opening 322. For example, a conductive layer (not shown in the figure) that also completely fills the self-aligned contact opening 322a is formed over the dielectric layer 318. Then, a chemical-mechanical polishing or etching back operation is carried out until the dielectric layer 318 is exposed. Hence, a plug 324 is formed in the self-aligned contact opening 322. The self-aligned contact 328 includes the plug 324 and the plug 312a, wherein the plug 324 and plug 312a are electrically connected, and the plug 312a and the heavily doped source/drain region 316 are also electrically connected.

In summary, major aspects of this invention includes:

1. A cap layer is formed over the gate structure acting as an etching stop layer for etching the conductive layer. In addition, a polysilicon layer that couples electrically with the source/drain region is formed over the substrate acting as an etching stop layer for another conductive layer. Therefore, the self-aligned contact not only has self-aligning properties, but the width of the self-aligned contact opening can also be wider than the distance between two neighboring gates tructures. Consequently, contact resistance between the source/drain region and the self-aligned contact can be maintained despite the reduction in line width due, perhaps, to a miniaturization.

2. The invention also provides a method that forms a conductive layer over the self-aligned contact opening first, and then forms a stud above the conductive layer in the self-aligned contact opening. Subsequently, the stud is removed to form another opening in the self-aligned contact opening that aligns with the source/drain region. Finally, conductive material is deposited into the opening to form a complete self-aligned contact.

3. The processing techniques used in the invention are compatible with current semiconductor manufacturing. Hence, the method can be easily incorporated into existing semiconductor production facilities.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a self-aligned contact comprising:
providing a substrate, and then forming a gate oxide layer over the substrate;
forming a conductive stack layer over the gate oxide layer;
forming a cap layer over the conductive stack layer;
patterning the cap layer, the conductive stack layer and the gate oxide layer to form a gate structure;
performing a first ion implantation to form a lightly doped source/drain region;
forming an insulating layer over the substrate, wherein the insulating layer also covers the gate structure;
patterning the insulating layer to form spacers on sidewalls of the gate structure, while simultaneously forming a self-aligned contact opening above the lightly doped source/drain region;
using the spacers as masks, performing a second ion implantation to form a heavily doped source/drain region within the lightly doped source/drain region;
forming a first conductive layer over the substrate, wherein the first conductive layer couples electrically with the heavily doped source/drain region;
forming a second conductive layer over the first conductive layer, wherein the material of the second conductive layer completely fills the self-aligned contact opening, and the second conductive layer is not conformal with the self-aligned contact opening;
patterning the second conductive layer to form a first plug inside the self-aligned contact opening;
patterning the second conductive layer using the first plug as a mask to form a second plug, wherein the second plug and the first plug together form a self-aligned contact, and the second plug couples electrically with the heavily doped source/drain region; and
forming a dielectric layer over the substrate, and then planarizing the dielectric layer to expose the first plug.

2. The method of claim 1, wherein the step of forming the cap layer includes depositing silicon oxide or silicon nitride.

3. The method of claim 1, wherein the step of forming the insulating layer includes depositing silicon oxide or silicon nitride.

4. The method of claim 1, wherein the step of forming the first conductive layer includes depositing polysilicon.

5. The method of claim 1, wherein the step of forming the second conductive layer includes depositing tungsten.

6. The method of claim 1, wherein the step of patterning the first conductive layer includes an anisotropic etching method.

7. The method of claim 1, wherein the step of patterning the second conductive layer includes an anisotropic etching method.

8. A method of forming a self-aligned contact comprising:
providing a substrate, and then forming a gate oxide layer over the substrate;
forming a conductive stack layer over the gate oxide layer;
forming a cap layer over the conductive stack layer;
patterning the cap layer, the conductive stack layer and the gate oxide layer to form a gate structure;
performing a first ion implantation to form a lightly doped source/drain region;

forming an insulating layer over the substrate, wherein the insulating layer also covers the gate structure;

patterning the insulating layer to form spacers on the sidewalls of the gate structure, while simultaneously forming a self-aligned contact opening above the lightly doped source/drain region;

using the spacers as masks, performing a second ion implantation to form a heavily doped source/drain region within the lightly doped source/drain region;

forming a first conductive layer over the substrate, wherein the first conductive layer couples electrically with the heavily doped source/drain region;

forming a stud layer over the first conductive layer, wherein the material of the stud layer completely fills the self-aligned contact opening;

patterning the stud layer to form a stud inside the self-aligned contact opening;

patterning the first conductive layer using the stud as a mask to form a first plug, wherein the stud and the first plug together completely occupies the self-aligned contact opening, and the first plug couples electrically with the heavily doped source/drain region;

forming a dielectric layer over the substrate, and then planarizing the dielectric layer to expose the stud;

removing the stud to form an opening in the dielectric layer, wherein the opening exposes the first plug; and forming a second plug inside the opening in the dielectric layer, wherein the second plug and the first plug together form a self-aligned contact.

9. The method of claim 8, wherein the step of forming the cap layer includes depositing silicon oxide or silicon nitride.

10. The method of claim 8, wherein the step of forming the insulating layer includes depositing silicon oxide or silicon nitride.

11. The method of claim 8, wherein the step of forming the first conductive layer includes depositing polysilicon.

12. The method of claim 8, wherein the step of forming the stud layer includes depositing silicon nitride.

13. The method of claim 8, wherein the step of patterning the first conductive layer includes an anisotropic etching method.

14. The method of claim 8, wherein the step of patterning the stud layer includes an anisotropic etching method.

15. The method of claim 8, wherein the step of removing the stud includes a wet etching method.

16. The method of claim 8, wherein the step of forming the second plug includes depositing tungsten.

17. A method of forming a self-aligned contact comprising:

providing a substrate, and then forming a gate oxide layer over the substrate;

forming a conductive stack layer over the gate oxide layer;

forming a cap layer over the conductive stack layer;

patterning the cap layer, the conductive stack layer and the gate oxide layer to form a gate structure;

forming a source/drain region in the substrate;

forming spacers on sidewalls of the gate structure, while simultaneously forming a self-aligned contact opening above the source/drain region; and forming a first plug and a second plug inside the self-aligned contact opening to form a complete self-aligned contact, wherein the second plug couples electrically with the source/drain region and the first plug completely fills the self-aligned contact opening.

18. The method of claim 17, wherein the step of forming the cap layer includes depositing silicon oxide or silicon nitride.

19. The method of claim 17, wherein the step of forming spacers on the sidewalls of the gate structure includes the steps of:

forming an insulating layer over the substrate, wherein the insulating layer also covers the gate structure; and patterning the insulating layer to form spacers on the sidewalls of the gate structure.

20. The method of claim 19, wherein the step of forming the insulating layer includes depositing silicon oxide or silicon nitride.

21. The method of claim 17, wherein the step of forming the first plug and the second plug in the self-aligned opening includes the steps of:

forming a first conductive layer over the substrate, wherein the first conductive layer couples with the source/drain region electrically;

forming a second conductive layer over the first conductive layer, wherein the second conductive layer at least fills the self-aligned contact opening completely;

patterning the second conductive layer to form the first plug inside the self-aligned contact opening; and patterning the first conductive layer using the first plug as a mask to form the second plug.

22. The method of claim 21, wherein the step of forming the first conductive layer includes depositing polysilicon.

23. The method of claim 21, wherein the step of forming the second conductive layer includes depositing tungsten.

24. The method of claim 21, wherein the step of patterning the first conductive layer includes an anisotropic etching method.

25. The method of claim 21, wherein the step of patterning the second conductive layer includes an anisotropic etching method.

26. The method of claim 21, wherein after the step of forming the first plug and the second plug, further includes the steps of:

forming a dielectric layer over the substrate; and planarizing the dielectric layer to expose the first plug.

* * * * *